United States Patent
Sinha et al.

(10) Patent No.: US 6,475,011 B1
(45) Date of Patent: Nov. 5, 2002

(54) LAND GRID ARRAY SOCKET ACTUATION HARDWARE FOR MCM APPLICATIONS

(75) Inventors: Arvind K. Sinha, Rochester; Roger D. Hamilton, Eyota; John L. Colbert, Byron, all of MN (US); John S. Corbin, Jr.; Danny E. Massey, both of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/948,195

(22) Filed: Sep. 7, 2001

(51) Int. Cl.[7] .............................................. H01R 13/62
(52) U.S. Cl. ...................... 439/330; 439/76.2; 439/342
(58) Field of Search .......................... 439/330, 73, 331, 439/76.1, 76.2, 70, 66, 342; 361/767, 769, 770, 809, 768; 257/778, 727

(56) References Cited

U.S. PATENT DOCUMENTS

| | | | | |
|---|---|---|---|---|
| 4,786,256 A | * | 11/1988 | Angeleri et al. | 439/72 |
| 5,152,695 A | * | 10/1992 | Grabbe et al. | 439/71 |
| 5,287,757 A | * | 2/1994 | Polaert et al. | 73/862 |
| 6,015,301 A | * | 1/2000 | Brodsky et al. | 439/73 |

* cited by examiner

*Primary Examiner*—Renee Luebke
*Assistant Examiner*—Phuongchi Nguyen
(74) *Attorney, Agent, or Firm*—Bockhop & Reich, LLP

(57) ABSTRACT

An apparatus for applying force to a multi-chip module, a printed wiring board and an interposer to facilitate electrical contact there-between, includes a plurality of load posts, a load transfer plate, a spring member, a backside stiffener plate and a spring actuator. The load posts are affixed to the multi-chip module and pass through the printed wiring board. The load transfer plate has a first stiffness. The spring member is disposed adjacent the load transfer plate and has a second stiffness that is less than the first stiffness. The a backside stiffener plate is disposed between the spring member and the printed wiring board and has a third stiffness that is greater than the second stiffness. The spring actuator engages the spring member to apply force to the backside stiffener plate, causing the substrate, the interposer and the printed wiring board to be held in contact.

14 Claims, 2 Drawing Sheets

LAND GRID ARRAY SOCKET ACTUATION HARDWARE FOR MCM APPLICATIONS

BACKGROUND OF THE INVENTION

1. Field of the Invention

The present invention relates to electrical connectors and more specifically to a device for connecting a multi-chip module to a printed wiring board.

2. Description of the Prior Art

Land grid array socket assemblies are common in the electronics industry for mounting single chip modules to printed wiring boards. The interconnection of a land grid array (LGA) module to a printed wiring board (PWB) requires the accommodation of a high area density of electronic contacts and must result in a highly reliable electronic connection over a range of operating environments. One method of interconnecting an LGA module to a PWB is by using a conductive interposer. The interposer has an array of electrical contacts on one surface which mirrors those of the LGA module and, on the opposing surface, an array of electrical contacts which mirrors those of the PWB. The mounting of the LGA module is then accomplished by aligning the electrical contacts of the LGA module, interposer and PWB and mechanically compressing the interposer.

A land grid array socket assembly using an interposer has several advantages over other more traditional methods of component mounting. The modules may be changed or easily upgraded in the field. Also, system assembly and rework costs may be reduced during production. The interposer reduces the effects of thermal expansion mismatch between the chip modules and the PWB by acting as a compliant member between the chip module substrate and the PWB surface. This compliant property of the interposer ensures electrical connectivity of the assembly over a range of thermal and dynamic operating environments.

The demand for higher performance in electronic equipment has led to the development of LGA socket and interposer assemblies for multi-chip module applications. However, the mounting of a multi-chip module presents challenges due to the greater number of electrical contacts and larger substrate size inherent with this type of electronic component.

A key challenge in using LGA sockets with interposers for multi-chip modules is the creation of a consistent mechanical clamping force to compress the interposer between the multi-chip module and the PWB. A consistent clamping force is required to ensure positive electrical connections between the components and to maintain the alignment of the assembly over various operating environments. A multi-chip module requires a high density of electrical contacts over the surface of the module substrate. This high density of contacts necessitates an initial accurate alignment of the assembly and a controlled and predictable compression force to maintain the multi-chip module, interposer and PWB in electrical contact.

Various hardware configurations have been employed to achieve the compression of the LGA socket, interposer and multi-chip module assembly. Typical existing systems use a spring member to compress the components together. The components are assembled upon the PWB and a spring member is deflected by spring actuation hardware thus clamping the components in place. One problem inherent in this approach is the range of spring deflections achieved, and hence the range of clamping forces generated, due to the mechanical tolerances presented by the assembly. The mechanical tolerances of the actuation hardware, multi-chip module, interposer and printed wiring board all directly effect the spring deflections generated in the complete assembly.

One example of an existing system for securing a multi-chip module in an LGA socket connection upon a printed wiring board is shown in FIG. 1. In such a system, a multi-chip module body 110 includes a substrate portion 112, upon which a plurality of integrated circuit chips are mounted, and a housing, which typically includes a heat sink. The substrate portion 112 is mounted upon a printed wiring board (PWB) 116 using an interposer 114. An interposer 114 is a thin sheet with a plurality of electrical contacts, arranged to mirror the electrical contacts of the substrate 112 and the printed wiring board 116, passing therethrough that facilitates electrically coupling the substrate 112 to the printed wiring board 116. The multi-chip module 110 is clamped into position by load posts 120, spring elements 122, and actuation nuts 124. The spring elements act upon a load plate 118 positioned on the underside of the PWB 116. As the actuation nuts 124 are tightened, the spring elements 122 are compressed between the load plate 118 and the actuation nuts 124. The actuation nuts 124 create a tensile load on the load posts 120 and the load plate 118 is compressed up against the PWB 116. The tensile load in the load posts results in a downward force on the multi-chip module body 110 which compresses the substrate 112, interposer 114 and PWB 116 together.

The spring actuation hardware typically includes a threaded actuation member which is used to compress the spring member. To compress the spring, the clearances in the assembly are first removed by advancing the actuation member. The actuation member is then further advanced a given number of turns to create a known deflection of the spring member. One source of uncertainty in this approach is that the determination of when the tolerances have been removed from the assembly is a subjective judgment. A second source of uncertainty is associated with monitoring the turn count of the actuation member. The end result is an imprecise displacement of the spring element and a resulting uncertainty in the compressive force applied to the multi-chip module, interposer and PWB assembly.

As further demonstrated in FIG. 1, existing systems apply the compressive force about the periphery of the assembly only. This non-uniform application of force results in an uneven deflection of the multi-chip module substrate 112, PWB 116 and interposer 114. This deflection of the components allows a corresponding variance in the compressive force seen by the individual electrical contacts across the surface of each component. The result is that the electrical contacts at the center of each mating component face are not as tightly compressed as the electrical contacts about the edges of the assembly, demonstrated by arrows 126. This variance in contact pressure reduces the integrity of the electrical connection when exposed to a range of operating environments.

Therefore, there is a need for a device that predictably applies even force to a multi-chip module and a printed wiring board.

SUMMARY OF TILE INVENTION

The disadvantages of the prior art are overcome by the present invention which, in one aspect, is an apparatus for applying force to a multi-chip module having a substrate, a printed wiring board having a first side and an opposite second side and an interposer. The interposer facilitates electrical contact between the substrate and the printed wiring board through the interposer. The multi-chip module and the interposer are disposed on the first side of the printed wiring board.

The apparatus includes a plurality of elongated spaced-apart load posts, a load transfer plate, a spring member, a backside stiffener plate, and a spring actuator. The load posts are affixed to the multi-chip module and pass through a plurality of post holes defined by the printed wiring board from the first side to the second side of the board. Each load post has a proximal end affixed to the multi-chip module and an opposite distal end that defines an engagement surface. The load transfer plate is disposed opposite the multi-chip module and spaced apart from the second side of the printed wiring board. The load transfer plate defines a plurality of openings through which the distal ends of each of the plurality of load posts pass. Each of the plurality of openings is shaped so as to engage the engagement surface of the distal end of a corresponding load post.

The spring member is disposed adjacent the load transfer plate between the load transfer plate and the printed wiring board. The backside stiffener plate is disposed between the spring member and the printed wiring board. The spring actuator is engageable with the spring member so that the spring actuator applies force to the backside stiffener plate, thereby causing the substrate, the interposer and the printed wiring board to be held in contact. The spring member has a stiffness which is substantially less than the stiffness of either the load transfer plate or the backside stiffener plate.

In another aspect, the spring member includes a plurality of similarly shaped spring plates placed in vertical alignment. Each spring plate defines a bushing hole passing through the body of the plate having a size sufficient to receive a portion of the spring actuator within the opening. The bushing hole is chamfered where the hole intersects the upper and lower surface of the spring plate. The spring plates include a center portion and a plurality of spaced-apart cantilevered beams extending radially from the center portion. Each beam ends in a beam end. Moreover, the shape of the cantilevered beams is chosen such that the load verses deflection curve for the spring plate is substantially linear.

Each spring plate further includes an alignment hole passing through each beam end. The load transfer plate has an inward surface and a plurality of truncated corners with an alignment pin positioned inwardly from the inward surface at each of the truncated corners. Each alignment pin is disposed so as to be in alignment with a different alignment hole of a beam end. The spring member is positioned over the alignment pins, upon the load transfer plate. A plurality of clips are affixed to a different one of the truncated corners and are shaped to hold a different beam end adjacent to a corresponding truncated corner.

The spring element defines a bushing hole passing therethrough and disposed substantially central to the spring member. The spring actuator includes an elongated actuation screw having a first end with a tool engagement portion extending therefrom. The actuation screw has a second end with a threaded portion extending therefrom and a screw collar disposed between the tool engagement portion and the threaded portion. The spring actuator also includes a bushing with an outer surface and defines a threaded passage passing longitudinally therethrough that is complimentary to the threaded portion of the actuation screw. The bushing also has a bushing collar extending outwardly from the outer surface. The bushing is positioned within the bushing hole of the spring element and the threaded actuator positioned within the bushing.

In yet another aspect, the substrate has a substrate thickness tolerance. The printed wiring board has a first side and an opposite second side and has a printed wiring board thickness tolerance. The interposer also has an interposer thickness tolerance. The deflection of the spring member is of a magnitude of at least eight times a total stacked tolerance. The total stacked tolerance includes the sum of the substrate thickness tolerance, the interposer thickness tolerance, the printed wiring board thickness tolerance, the load post length tolerance, and the actuator length tolerance.

In yet another aspect, the apparatus also includes a backside stiffener plate, or a load transfer plate, or both a backside stiffener plate and a load transfer plate. The backside stiffener plate is disposed between the spring member and the printed wiring board and has a backside stiffener plate thickness tolerance. The load transfer plate is disposed opposite the multi-chip module and is spaced apart from the second side of the printed wiring board. The load transfer plate is coupled to the distal ends of the load posts and has a load transfer plate thickness tolerance.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
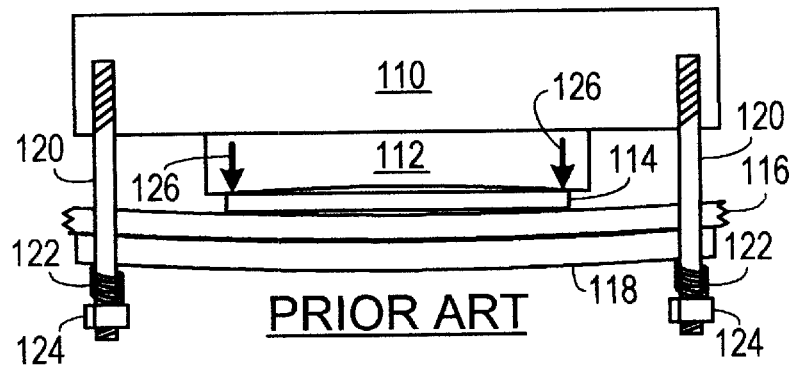
FIG. 1 is a cross-sectional view of one example of a prior art device.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2A:
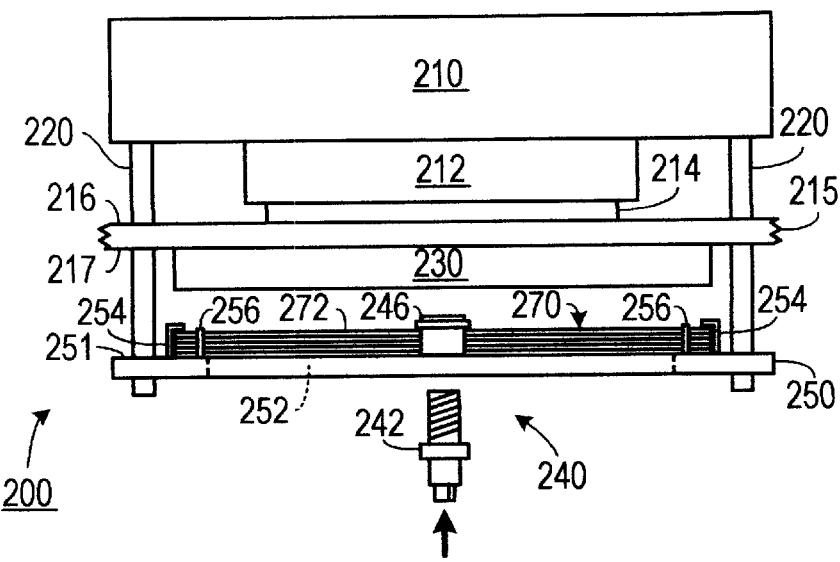
FIG. 2A is a cross-sectional view of an un-compressed socket actuator, according to one aspect of the invention.

As shown in FIG. 2A, a multi-chip module 210, including a substrate 212, is electrically mated to a printed wiring board 215 using an interposer 214 using an apparatus 200 according to the invention. The interposer 214 provides appropriate electrical connectivity between the electrical contacts of the multi-chip module substrate 212 and the electrical contacts of the printed wiring board 215. The printed wiring board 215 has an upper surface 216 and a lower surface 217. The interposer 214 is positioned upon the upper surface 216 and is aligned with the electrical contacts of the printed wiring board 215. The multi-chip module substrate 212 is positioned upon the interposer 214 with the electrical contacts of the multi-chip module substrate 212 aligning with the electrical contacts interposer 214, the contacts of which aligning with the contacts of the printed wiring board 215.

The substrate 212, multi-chip module 210 and interposer 214 are clamped in position to the upper surface 216 using four load posts 220. The load posts 220 are in threaded engagement with the housing of the multi-chip module 210 and pass through openings in the printed wiring board 215. A load transfer plate 250 is affixed to the lower ends of the load transfer posts 220 below the printed wiring board 215, and opposite the multi-chip module substrate 212 and interposer 214.

The load transfer plate 250 supports a spring assembly 270 used to apply force to the multi-chip module 210, the interposer 214 and the printed wiring board 215. The spring assembly 270 includes a plurality of spring plates 272 stacked in vertical alignment. The spring plates 272 define openings to receive therein alignment pins 256 extending from the upper surface 251 of the load transfer plate 250. The spring assembly 270 is positioned upon the upper surface 251 of the load transfer plate 250 over the alignment pins 256 and is held in place by retention clips 254. The load transfer plate 250 has a center opening 252 such that only the edges of the spring assembly 270 are supported by the load transfer plate 250.

Figure 2B:
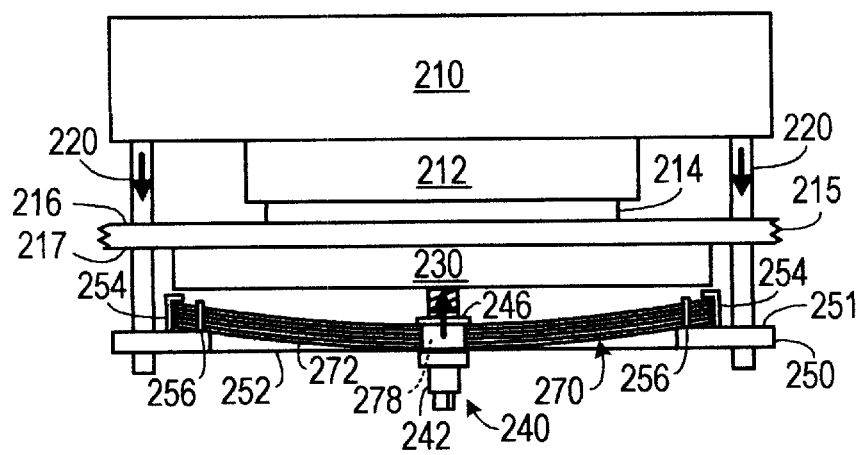
FIG. 2B is a cross-sectional view of a compressed socket actuator, according to one aspect of the invention.

A spring actuator assembly 240 includes a bushing 246 and an actuation screw 242. The bushing 246 is placed in an opening 278 at the center of the spring plates 272 and is internally threaded. The actuation screw 242 has complimentary external threads and is positioned within the bushing 246. A backside stiffener plate 230 is also positioned upon the lower surface 217 of the printed wiring board 215, As shown in FIG. 2B, the spring actuator 242 is threaded into the bushing 246 until the end of the actuation screw contacts the backside stiffener plate 230. As the actuation screw 242 is further threaded into the bushing 246, the backside stiffener 230 is compressed against the lower surface 217 of the printed wiring board 215 as the center portion of the spring assembly 270 deflects downward. The edges of the spring assembly 270 are supported by the upper surface 251 of the load transfer plate 250, and restrained by the alignment pins 256 and retention clips 254. When the actuation screw 242 is tightened, the center portion of the spring assembly 270 deflects downward into the center opening 252 of the load transfer plate 250. As the center of the spring assembly 270 deflects downward, a downward force is applied to the load transfer plate 250 where the edges of spring assembly 270 are supported by the load transfer plate upper surface 251. As the load transfer plate 250 is supported by the load transfer posts 220, the downward force applied to the load transfer plate 250 generates a tensile force in the load transfer posts 220. On the opposite end of the load posts 220, the tensile force pulls downward upon the multi-chip module 210. This downward force imparted upon the multi-chip module 210 compresses the substrate 212 and interposer 214 between the multi-chip module 210 and the upper surface 216 of the printed wiring board 215. In this manner, the substrate 212 and the interposer 214 are restrained upon the printed wiring board 215 in proper alignment, thereby ensuring electrical contact between the components over a broad range of thermal and dynamic operating environments.

Figure 3:
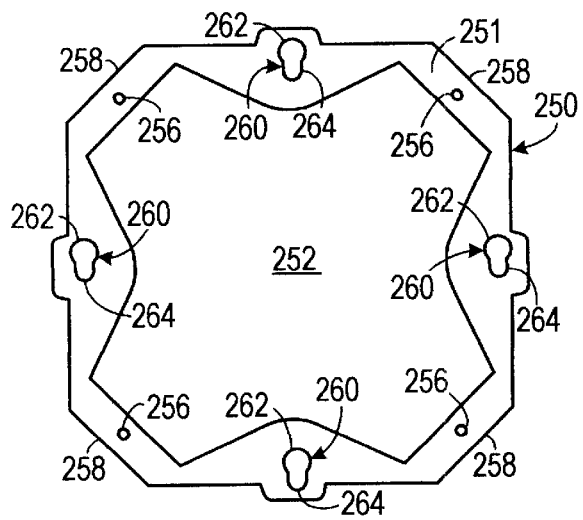
FIG. 3 is a top view of a load transfer plate according to the embodiment shown in FIG. 2.

As shown in FIG. 3, the load transfer plate 250 is essentially square in shape with truncated corners 258 and a center opening 252. At each truncated edge 258, an alignment pin 256 is offset inwardly and protrudes vertically from the load transfer plate upper surface 251. Four shaped openings 260 are configured to receive the ends of load transfer posts 220. The larger diameter openings 262 are sized to allow the full diameter of load post 220 to pass while the adjoining smaller diameter openings 264 are intended to capture a reduced diameter portion of the load post 220.

Figure 4:
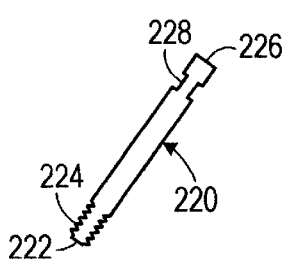
FIG. 4 is a plan view of a load post according to the embodiment shown in FIG. 2.

As shown in FIG. 4, the load posts 220 have a cylindrical shape with a proximal end 222 having a threaded portion 224 for complimentary engagement with threaded openings in the housing of the multi-chip module 210, and a distal end 226 having a reduced diameter portion 228 for engagement with the shaped openings 264 of the load transfer plate 250. During assembly of the socket actuator, the distal ends 226 of load posts 220 pass through the larger diameter load transfer plate openings 262. The load transfer plate 250 is then moved normal to the load post 228 cylindrical axis so that the reduced diameter openings 264 engage the reduced diameter portion 228 of the load post 220. In this manner, the load transfer plate 250 is restrained a fixed distance below the printed wiring board 215 and may transfer an axial load to the load posts 220. As may also be appreciated by one skilled in the art, a variety of other means may be used to secure the load transfer plate 250 to the load posts 228 such as retaining clips, threaded connections, or the like.

Figure 5:
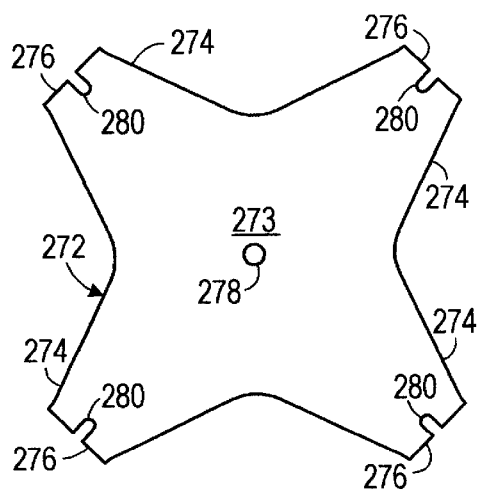
FIG. 5 is a top view of a spring plate according to the embodiment shown in FIG. 2.
Figure 6:
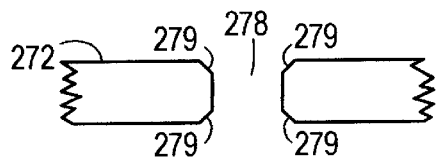
FIG. 6 is a cross-sectional view of a bushing hole.

As shown in FIG. 5, the spring plate 272 has a center portion 273 with four radially extending cantilevered beam portions 274 extending outwardly therefrom. The beam portions 274 taper as they extend radially from the center section 273 and terminate at beam ends 276. Offset from each beam end 276 is a pin opening 280 (typically U-shaped to allow for pin movement). In the center of each spring plate 272 is an opening 278 sized to allow a portion of the actuator 240 to pass therethrough. As shown in FIG. 6, a chamfer 279 extends around the periphery of the opening 278 at both the upper and lower surfaces of the spring plate 272. The chamfer 279 reduces stress in the spring plates 272.

Figure 7:
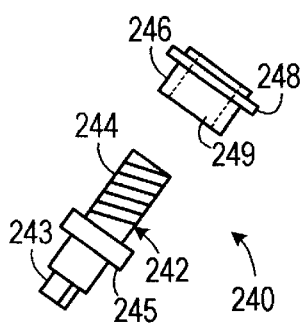
FIG. 7 is an exploded plan view of a spring actuator according to the embodiment shown in FIG. 2.

As shown in FIG. 7, the spring actuator assembly 240 includes an actuation screw 242 and a bushing 246. The actuation screw 242 has an external thread 244 extending along the body thereof, which terminates in a stepped portion 245 having a diameter substantially larger than the major diameter of the thread. Opposite the external thread 244 is an engagement surface 243 configured for engagement by a driver tool. The bushing 246 is in the form of a hollow cylinder with an external stepped diameter 248 and an internal threaded bore 249.

As shown in FIG. 2B, during assembly the bushing 246 is pressed into the opening 278 at the center of the spring assembly 270 until the stepped portion 248 bears against the upper surface of the spring assembly 270. The actuation screw 242 is then threaded into the bushing 246 until the threaded end 244 contacts the backside stiffener plate 230. As the actuation screw 242 is tightened, the spring assembly 270 is deflected downward. As the actuation screw 242 is further tightened, the stepped portion 245 contacts the bottom of spring assembly 270. After the stepped portion 245 and spring assembly 270 have been drawn into contact, additional tightening of the actuation screw 242 win not result in any additional deflection of the spring assembly 270. Since the deflection of the spring assembly 270 has a fixed maximum value, the tensile force developed in the load posts 220, and the resulting compressive force holding the multi-chip module substrate 212 and interposer 214 against the printed wiring board 215 also have a fixed maximum value.

Figure 8:
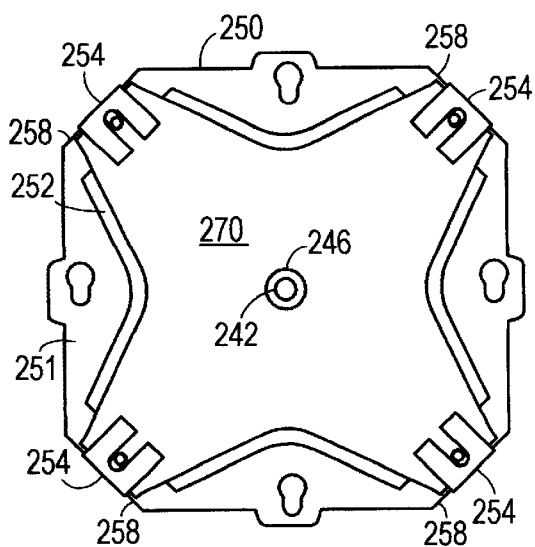
FIG. 8 is a bottom view of a load transfer plate, a spring member and an actuator according to the embodiment shown in FIG. 2.

The assembled load transfer plate 250, the spring assembly 270, a screw actuator 244, and a bushing 246 are shown in FIG. 8. At each of the four truncated corners 258 of the load transfer plate 250, retention clips 254 secure the spring assembly 270 to the load transfer plate 250.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. An apparatus for applying force to a multi-chip module having a substrate, a printed wiring board having a first side and an opposite second side and an interposer, that facilitates electrical contact between the substrate and the printed wiring board through the interposer, the multi-chip module and the interposer being disposed on the first side of the printed wiring board, the apparatus comprising:
   a. a plurality of elongated spaced-apart load posts, each load post affixed to the multi-chip module, that pass through a plurality of post holes defined by the printed wiring board from the first side to the second side, each load post having a proximal end affixed to the multi-chip module and an opposite distal end that defines an engagement surface;
   b. a load transfer plate, disposed opposite the multi-chip module and spaced apart from the second side of the printed wiring board, the load transfer plate defining a plurality of openings through which the distal ends of each of the plurality of load posts pass, each of the plurality of openings shaped so as to be able to engage the engagement surface of the distal end of a corresponding load post, the load transfer plate having a first stiffness;
   c. a spring member disposed adjacent the load transfer plate between the load transfer plate and the printed wiring board, the spring member having a second stiffness that is less than the first stiffness;
   d. a backside stiffener plate disposed between the spring member and the printed wiring board, the backside stiffener plate having a third stiffness that is greater than the second stiffness; and
   e. a spring actuator, engageable with the spring member so that the spring actuator applies force to the backside stiffener plate, thereby causing the substrate, the interposer and the printed wiring board to be held in contact.

2. The apparatus of claim 1, wherein the spring member comprises a plurality of similarly shaped spring plates placed in vertical alignment.

3. The apparatus of claim 1, wherein the spring member defines a bushing hole passing therethrough and disposed substantially central to the spring member and wherein the spring actuator comprises:
   a. an elongated actuation screw including a first end having a tool engagement portion extending therefrom, an opposite second end having a threaded portion extending therefrom from and a screw collar disposed between the tool engagement portion and the threaded portion; and
   b. a bushing including an outer surface and a bushing collar extending outwardly from the outer surface, the bushing defining a threaded passage passing longitudinally therethrough and complimentary to the threaded portion of the actuation screw.

4. The apparatus of claim 1, wherein the spring member comprises:
   a. a center portion; and
   b. a plurality of spaced-apart cantilever beams extending radially from the center portion, each beam ending in a beam end.

5. The apparatus of claim 4, wherein each beam end defines an alignment hole passing therethrough, wherein the load transfer plate has an inward surface and a plurality of truncated corners and further comprises:
   a. an alignment pin inwardly from the inward surface of the load transfer plate at each of the truncated corners, each alignment pin disposed so as to be in alignment with a different alignment hole of a beam end; and
   b. a plurality of clips, each clip being affixable to a different one of the truncated corners and each shaped to hold a different beam end adjacent a corresponding truncated corner.

6. An apparatus for applying force to a multi-chip module having a substrate, a printed wiring board having a first side and an opposite second side, and an interposer, that facilitates electrical contact between the substrate and the printed wiring board through the interposer, the multi-chip module and the interposer being disposed on the first side of the printed wiring board, the apparatus comprising:
   a. a plurality of elongated spaced-apart load posts that pass through a corresponding plurality of openings defined by the printed wiring board from the first side to the second side, each load post having a load post length tolerance, a proximal end affixed to the multi-chip module and an opposite distal end,
   b. a spring member disposed on the second side of the printed wiring board, the spring member being coupled to the distal ends of the load posts, the spring member comprising a plurality of stacked similarly shaped spring plates; and
   c. a spring actuator, engageable with the spring member so that the actuator applies force to the printed wiring board, to cause a deflection of the spring member, thereby causing the substrate, the interposer and the printed wiring board to be held in electrical contact.

7. The apparatus of claim 6, wherein each spring plate has a first side and an opposing second side, each spring plate defining a bushing hole passing therethrough from the first side to the second side, the bushing hole having a size sufficient to receive a portion of the spring actuator therein, wherein the bushing hole is chamfered.

8. An apparatus for applying force to a multi-chip module having a substrate, the substrate having a substrate thickness tolerance, a printed wiring board having a printed wiring board thickness tolerance, a first side and an opposite second side, and an interposer, that facilitates electrical contact between the substrate and the printed wiring board through the interposer, the interposer having a interposer thickness tolerance, the multi-chip module and the interposer being disposed on the first side of the printed wiring board, the apparatus comprising:

a. a plurality of elongated spaced-apart load posts that pass through a corresponding plurality of openings defined by the printed wiring board from the first side to the second side, each load post having a load post length tolerance, a proximal end affixed to the multi-chip module and an opposite distal end;

b. a spring member disposed on the second side of the printed wiring board and coupled to the distal ends of the load posts; and c. a spring actuator, having a actuator length tolerance, engageable with the spring member so that the actuator applies force to the printed wiring board, to cause a deflection of the spring member in an amount of at least eight times a total stacked tolerance, the total stacked tolerance including the sum of the substrate thickness tolerance, the interposer thickness tolerance, the printed wiring board thickness tolerance, the load post length tolerance, and the actuator length tolerance, thereby causing the substrate, the interposer and the printed wiring board to be held in electrical contact.

9. The apparatus of claim 8, further comprising a backside stiffener plate, having a backside stiffener plate thickness tolerance, that is disposed between the spring member and the printed wiring board, wherein the sum of the total stacked tolerance further includes the backside stiffener plate thickness tolerance.

10. The apparatus of claim 8, wherein a load transfer plate, having a load transfer plate thickness tolerance, is disposed opposite the multi-chip module and spaced apart from the second side of the printed wiring board, the load transfer plate being coupled to the distal ends of the load posts, and wherein the sum of the total stacked tolerance further includes the load transfer plate thickness tolerance.

11. A spring member for use in an apparatus for applying force to a multi-chip module, an interposer and a printed wiring board, comprising:

a. a center portion; and b. a plurality of spaced-apart cantilever beams extending radially from the center portion;

the shape of the cantilever beams being such that a load versus deflection curve for the spring member is substantially linear.

12. The spring member of claim 11, wherein the plurality of spaced-apart cantilever beams comprises four cantilever beams.

13. The spring member of claim 11, wherein the center portion defines a substantially centrally disposed bushing hole passing therethrough.

14. The spring member of claim 11, further comprising a plurality of similarly shaped spring plates placed in vertical alignment.

* * * * *